(12) United States Patent
Kuroki

(10) Patent No.: US 7,439,126 B2
(45) Date of Patent: Oct. 21, 2008

(54) METHOD FOR MANUFACTURING SEMICONDUCTOR MEMORY

(75) Inventor: Keiji Kuroki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 25 days.

(21) Appl. No.: 11/601,720

(22) Filed: Nov. 20, 2006

(65) Prior Publication Data

US 2007/0141782 A1    Jun. 21, 2007

(30) Foreign Application Priority Data

Dec. 21, 2005    (JP)    ............................. 2005-368212

(51) Int. Cl.
*H01L 21/8234*    (2006.01)
(52) U.S. Cl. .................. 438/238; 438/239; 438/386; 438/399; 257/296; 257/E27.084; 257/E27.097
(58) Field of Classification Search ................ 438/238, 438/239, 386, 399; 257/296, E27.084, E27.097
See application file for complete search history.

(56) References Cited

U.S. PATENT DOCUMENTS

| | | | | |
|---|---|---|---|---|
| 4,997,790 A | * | 3/1991 | Woo et al. ................... | 438/586 |
| 5,739,563 A | * | 4/1998 | Kawakubo et al. .......... | 257/295 |
| 6,750,492 B2 | * | 6/2004 | Mikawa et al. .............. | 257/295 |
| 6,825,082 B2 | * | 11/2004 | Kim et al. .................... | 438/253 |
| 7,247,903 B2 | * | 7/2007 | Inoue et al. .................. | 257/296 |
| 2003/0049903 A1 | * | 3/2003 | Mitani ......................... | 438/253 |
| 2006/0022241 A1 | * | 2/2006 | Shimojo et al. ............. | 257/296 |

FOREIGN PATENT DOCUMENTS

| | | |
|---|---|---|
| JP | 2000-277711 | 10/2000 |
| JP | 2001-230383 | 8/2001 |
| JP | 2002-076302 | 3/2002 |

* cited by examiner

*Primary Examiner*—Andy Huynh
(74) *Attorney, Agent, or Firm*—Young & Thompson

(57) ABSTRACT

A method for manufacturing a semiconductor memory having a memory cell selection transistor and a capacitor, comprises a step of forming a polysilicon plug having a large-diameter portion on a side of the capacitor, a step of forming a hole reaching the large-diameter portion by etching an insulating film formed on the large-diameter portion using the large-diameter portion as an etching stopper layer, and a step of forming a conductive film inside the hole so as to serve as an electrode for the capacitor.

1 Claim, 8 Drawing Sheets

Fig. 12A
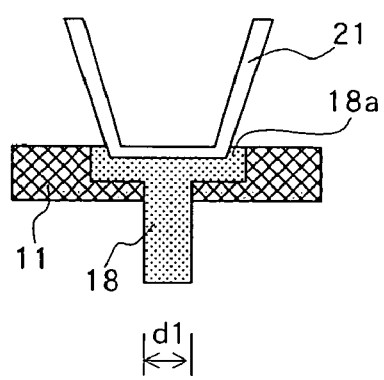
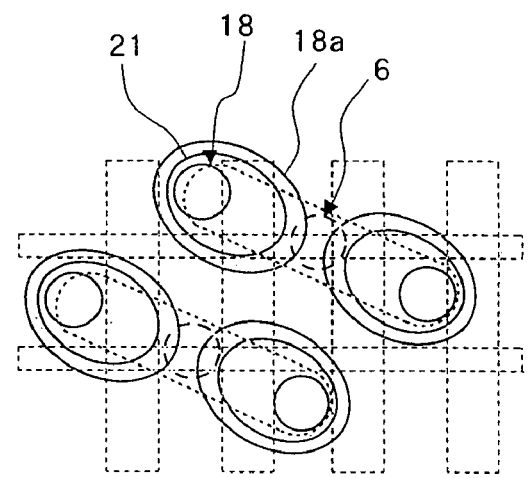
Fig. 12B

METHOD FOR MANUFACTURING SEMICONDUCTOR MEMORY

BACKGROUND OF THE INVENTION

1. Field of the Invention

The present invention relates to a method for manufacturing a semiconductor memory.

2. Description of the Related Art

A semiconductor memory (DRAM: dynamic random access memory) is made up of a selection transistor and a capacitor. With the growing miniaturization of a memory cell due to improvement in microfabrication techniques, the decrease in the amount of charge storage of a capacitor has become problematic. FIG. 1 schematically illustrates a cross section of a structure of a DRAM in the process of manufacture using a conventional method. Lower electrodes 119 of the capacitor and bit lines 108 are already formed in The DRAM shown in FIG. Further, polysilicon plugs 116 serving as capacitive contacts for connecting selection transistors, not shown, to lower electrodes 119 are already formed as well.

The DRAM shown in FIG. 1 employs a COB (Capacitor Over Bit-line) structure in order to respond to the decrease in the amount of charge storage mentioned above. In particular, a cup-shaped (cylindrical) capacitor is formed over bit line 108 and the height of the capacitor is increased so that the surface area of lower electrode 119 is increased.

Polysilicon capacitive contact plug 116 has been formed by creating a contact hole opening between bit lines 108 using an SAC (Self Aligned Contact) etching technique which has a high etching selection ratio for silicon nitrides (bit line 108 and insulating film 109). However, the achievement of a finer design or a finer line for a memory cell causes difficulty in using the SAC etching. Also, a necessity has arisen to ensure a short margin between polysilicon plug 116 and bit line 108. In light of this, the diameter of each polysilicon plug 116 has recently been reduced, and polysilicon plug 116 has been formed using a non-SAC etching technique.

In order to form lower electrode 119, it is necessary to form a hole in silicon oxide film 117 by dry etching. However, the center of polysilicon plug 116 and that of lower electrode 119 are not in alignment with each other. In particular, in order to arrange lower electrodes 119 having high density, each of lower electrodes 119 is substantially elliptically formed with its major axis provided along the direction of a bit contact, not shown. Accordingly, a non-superimposed region is present between polysilicon plug 116 and lower electrode 119, and it is necessary that the hole mentioned above have a shape that conforms to the shape of lower electrode 119. Therefore, there is concern that, in forming the hole mentioned above by dry etching, a region corresponding to the non-superimposed region will be abnormally etched such that the hole will unavoidably reach bit line 108. An interlayer insulation film (silicon nitride film 111) has been formed for use as an etching stopper layer in dry etching. However, when removing silicon nitride film 111 at a later step, an interlayer insulation film (silicon oxide film 110) around polysilicon plug 116 is also etched, which results in forming a step in silicon oxide film 110. As a result, a step (unevenness) is also formed in the bottom face of lower electrode 119, as shown in FIG. 2. The step formed in the bottom face of lower electrode 119 is likely to induce an increase of leak current due to deterioration of coverage or concentration of an electric field in lower electrode 119. For this reason, after forming polysilicon plug 116, a pad (not shown) made of polysilicon having a larger diameter than plug 116 has been formed on plug 116. As a result, polysilicon plug 116 and lower electrode 119 are brought into conduction with each other through the pad. Details of conventional methods for manufacturing a semiconductor memory are described, for example, in Japanese Patent Laid-Open No. 2002-076302, Japanese Patent Laid-Open No. 2001-230383 and Japanese Patent Laid-Open No. 2000-277711.

The conventional methods for manufacturing a semiconductor memory have raised problems as follows:

(1) As already mentioned above, in order to form lower electrode 119 shown in FIG. 1, it is necessary to form a hole in silicon oxide film 117 shown in the figure by etching. However, when the aspect ratio (depth/diameter) of the hole is increased in order to increase the height of the capacitor, the diameter at the lower end of the hole becomes small relative to the diameter at the upper end of the hole. In addition, the diameter of polysilicon capacitive contact plug 116 tends to become smaller as mentioned above. As a result, the contact area between lower electrode 119 and polysilicon plug 116 is decreased and contact resistance is increased.

(2) Since polysilicon capacitive contact plug 116 is formed first, and then the polysilicon pad is formed on plug 116, the number of steps is increased.

SUMMARY OF THE INVENTION

An object of the present invention is to resolve at least one of the above problems.

A method for manufacturing a semiconductor memory of the present invention relates to a method for manufacturing a semiconductor memory having a memory cell selection transistor and a capacitor. In particular, the method includes a step of forming a plug for establishing an electrical connection between the memory cell selection transistor and the capacitor, the plug having a large-diameter portion on a side of the capacitor. The diameter of the large-diameter portion is larger than that of the remaining portion of the plug. The method also includes a step of forming a silicon oxide-based insulating film on the large-diameter portion of the plug. Further, the method includes a step of forming a hole that reaches the large-diameter portion, by effecting etching to the insulating film using the large-diameter portion of the plug as an etching stopper layer. Additionally, the method includes a step of forming a conductive film inside the hole so as to serve as an electrode of the capacitor.

The large-diameter portion of the plug mentioned above functions as a stopper layer when etching is effected to the insulating film. Accordingly, depending on the material of the plug, over-etching time can be increased to elongate the diameter of the lower end portion of the hole. Elongation of the diameter at the lower end portion of the hole increases the surface area of conductive film which is formed in the hole later, so that the capacity of the capacitor is increased. In case the insulating film that is to be etched is made of a silicon oxide base, polysilicon is preferable as a plug material. However, the plug material is not limited to polysilicon, but a metal material, such as titanium nitride or tungsten, for example, may be used.

The above and other objects, features and advantages of the present invention will become apparent from the following description with reference to the accompanying drawings which illustrate examples of the present invention.

BRIEF DESCRIPTION OF THE DRAWINGS

FIG. 12A is an enlarged cross section of a contact portion between a lower electrode and the plug; and FIG. 12B is a schematic diagram showing a positional relation between the lower electrode and the plug.

DESCRIPTION OF THE PREFERRED EMBODIMENTS

This application is based upon and claims the benefit of priority from Japanese Patent Application No. 2005-368212 filed on Dec. 21, 2006, the content of which is incorporated be reference.

With reference to FIGS. 3 to 11, one example of an embodiment of a method for manufacturing a semiconductor memory of the present invention is described hereinafter. These figures each illustrate the cross-sectional structure of the semiconductor memory (DRAM) at each of the steps of the manufacturing method according to the present example. In particular, each of the figures schematically illustrates a structure in a cross section parallel to gate wiring.

Figure 3:
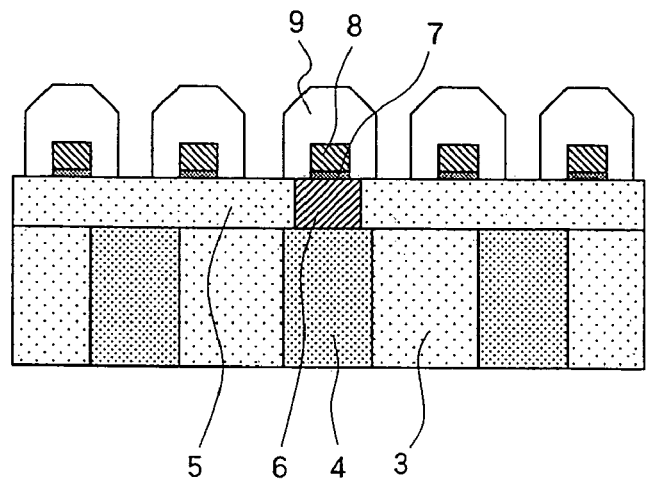
FIGS. 3 to 11 are cross sections of a semiconductor memory in the process of manufacture using a method of the present invention.

FIG. 3 illustrates a cross-sectional structure of a DRAM after formation of a bit line. After forming a gate electrode, which is used for a memory cell selection transistor on a semiconductor substrate gate interlayer film 3 is formed. Further, polysilicon plug 4 is formed through gate interlayer film 3 for electrical connection with a diffusion layer of the transistor, and interlayer insulation film 5 is also formed. Then, metal plug 6 is formed in advance for electrical connection with subsequently formed bit line 8, and then bit line 8 is formed. Specifically, tungsten nitride film 7 and tungsten film 8 are formed, followed by dry etching of these films 7 and 8 to form bit line 8. Then, an insulating film (silicon nitride film 9) is formed around bit line 8.

Figure 4:
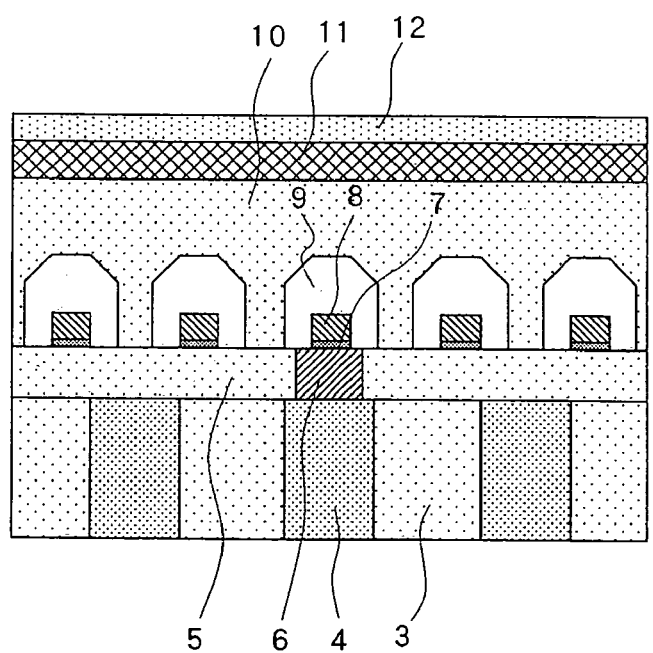

Subsequently, as shown in FIG. 4, an interlayer insulation film (silicon oxide film 10) is formed, and then a surface of thus formed silicon oxide film 10 is planarized. In the present example, planarization was carried out using a CMP (Chemical Mechanical Polishing) process. The thickness of silicon oxide film 10 after completing the planarization process is 300 nm. Then, an interlayer insulation film (silicon nitride film 11) has a thickness of 100 nm is formed on silicon oxide film 10, which is followed by the formation of an interlayer insulation film (silicon oxide film 12) having a thickness of 50 nm thick.

Figure 5:
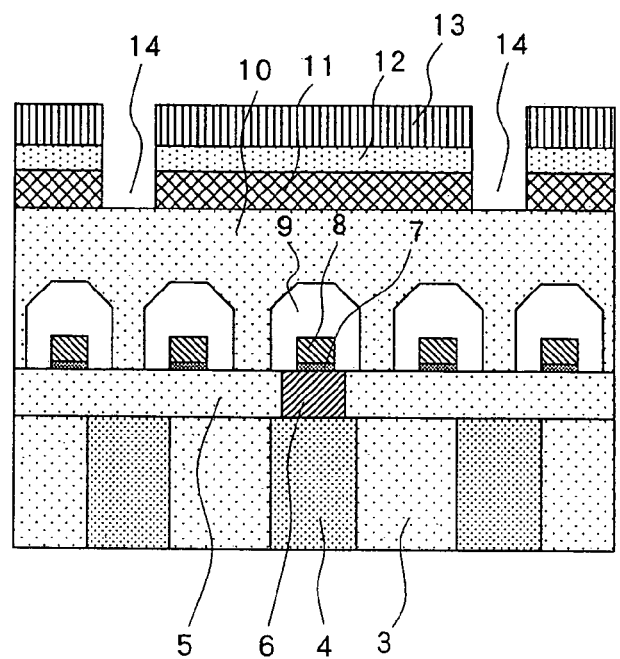

Then, as shown in FIG. 5, resist mask 13 is formed using photolithography technique. Thereafter, silicon oxide film 10 and silicon nitride film 11 are etched to form first hole 14 by the dry etching process, followed by removing resist mask 13.

Figure 6:
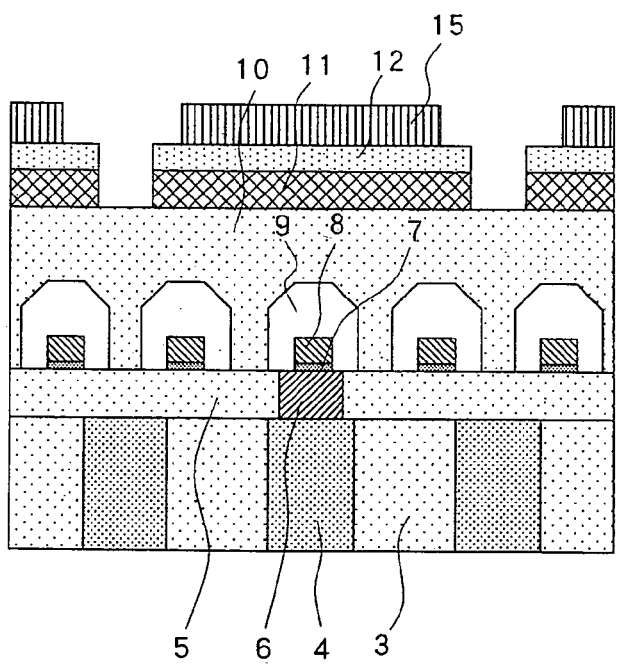
Figure 7:
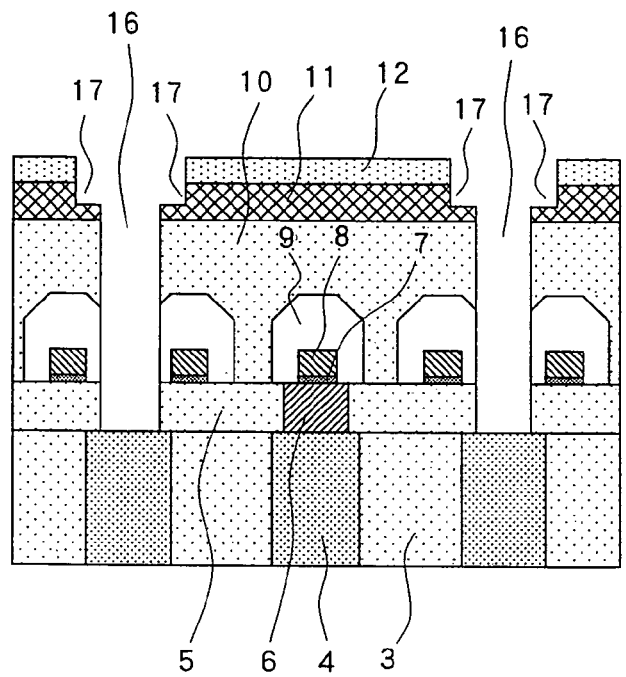

Then, as shown in FIG. 6, resist mask 15 is formed on silicon oxide film 12 so as to have a diameter larger than that of hole 14. Next, second hole 16 shown in FIG. 7 is formed according to the SAC etching process which set a high etching selection ratio for the silicon nitride film to form second hole 16 shown in FIG. 7. In this regard, silicon oxide film 12 functions as a sacrificial film from the stage of starting dry etching to the stage of attaining stabilization in the etching characteristics. Specifically, silicon oxide film 12 also controls the amount of etching in silicon nitride film 11 when SAC etching is performed. In SAC etching, by setting the etching selection ratio of the silicon oxide film and the silicon nitride film ($SiO_2/Si_3N_4$) at around "10", the etching speed for both of the films can be controlled, whereby recess 17 can be formed in silicon nitride film 11. The conditions for SAC etching in this case are, for example, an etching gas of Ar+$C_5F$+$O_2$=1400 sccm+25 sccm+32 sccm, a processing pressure of 40 mTorr and an RF power of 2800 W. It should be appreciated that hole 16 formed in this process reaches polysilicon plug 4.

Figure 8:
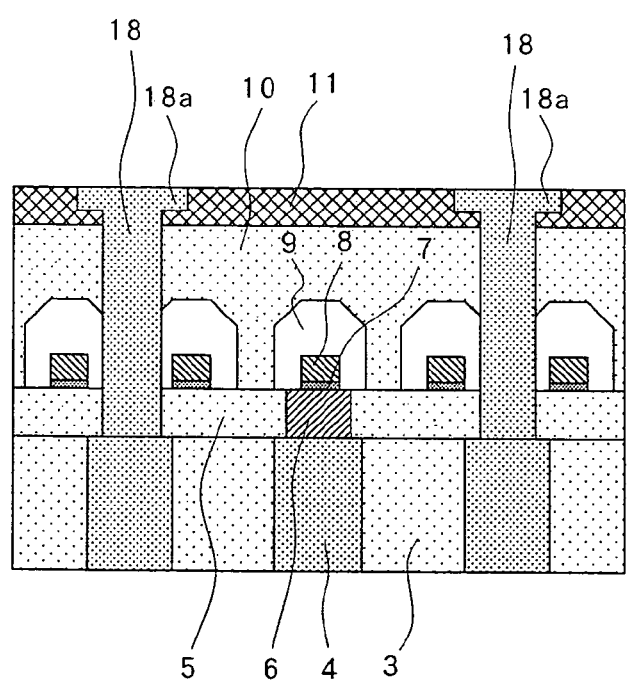

Subsequently, polysilicon is deposited inside hole 16 and on silicon nitride film 11 to form a polysilicon film. The thus formed polysilicon film is either planarized by using the CMP process or etch-backed by dry etching to form polysilicon plug 18 as shown in FIG. 8. At this moment, recess 17 formed in the previous step is present in silicon nitride film 11. Accordingly, large-diameter portion 18a, which has a diameter lager than that of the remaining portion of the plug, is formed at an upper end (on a side of a capacitor) of polysilicon plug 18, so that polysilicon plug 18 resultantly has an inversely convexed shape as a whole.

Figure 9:
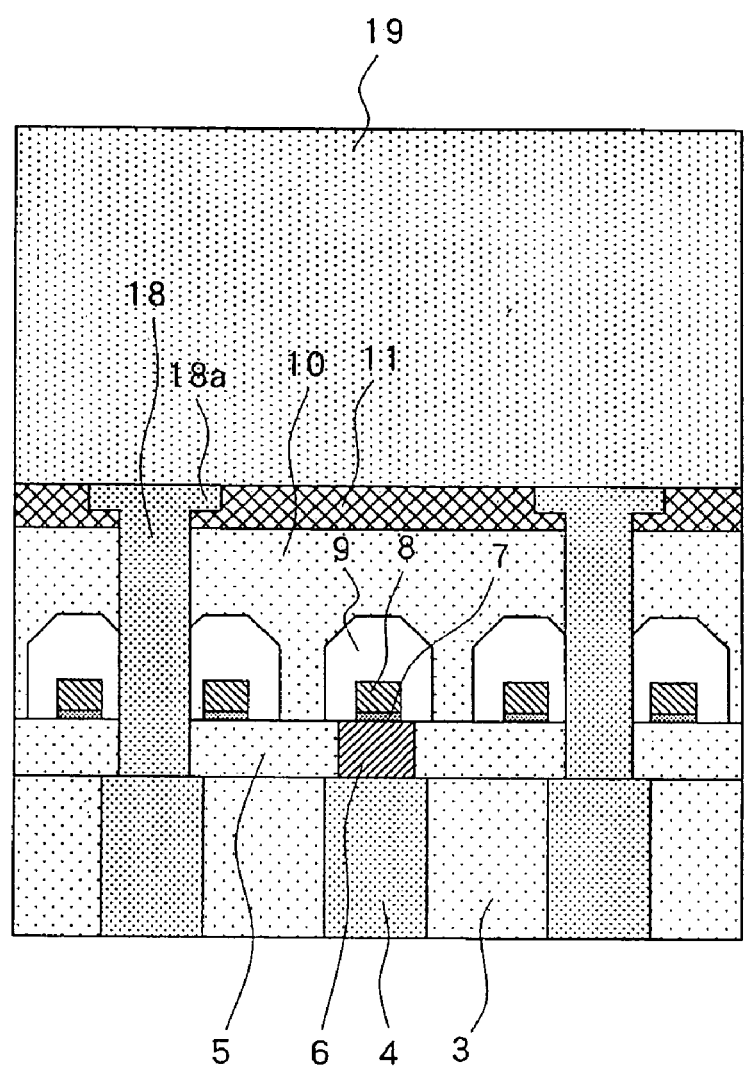
Figure 10:
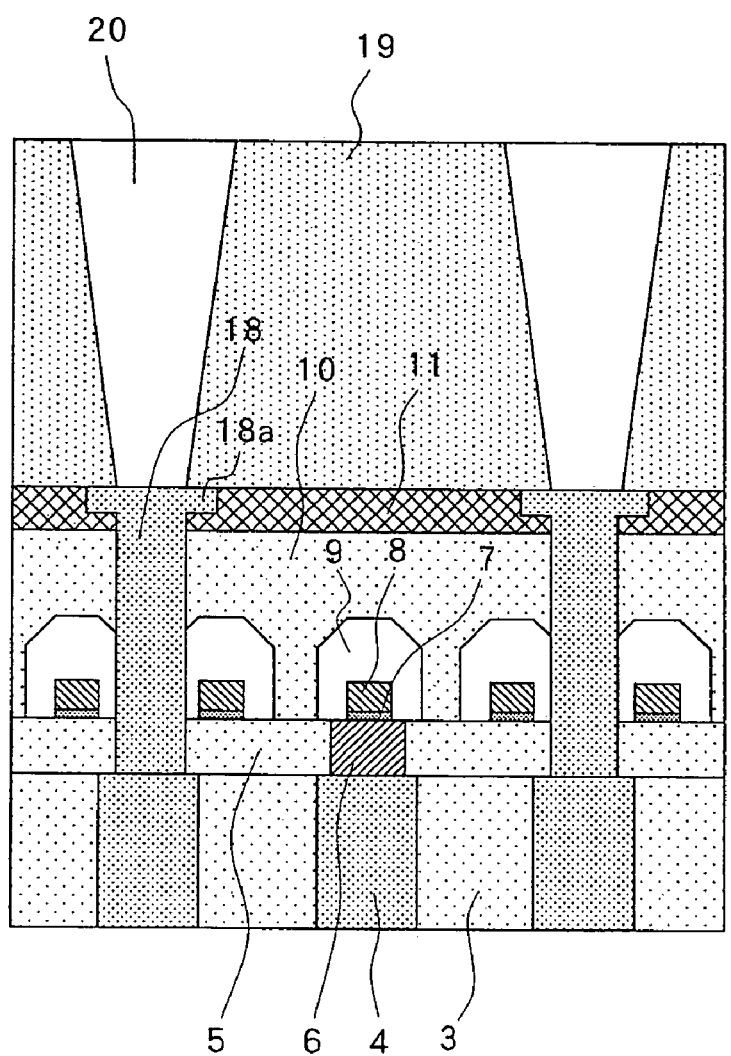
Figure 11:
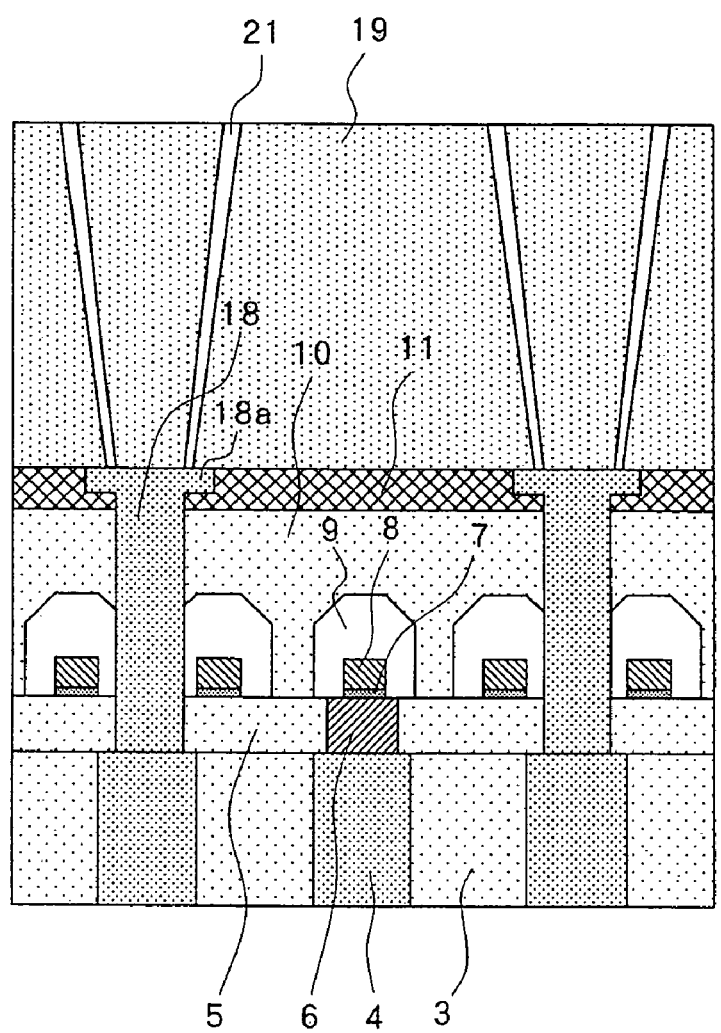

Then, as shown in FIG. 9, silicon oxide film 19 is formed. Thereafter, third hole 20 is formed on silicon oxide film 19 by dry etching in order to make lower electrode 21 (FIG. 11) as shown in FIG. 10. In this case, large-diameter portion 18a of polysilicon plug 18 functions as an etching stopper layer. Then, lower electrode 21 shown in FIG. 11 is formed in hole 20 using polysilicon, TiN or the like. Then, a dielectric insulating film is formed around lower electrode 21, and an upper electrode for the capacitor formed on an outer side of the dielectric insulating film.

Figure 1:
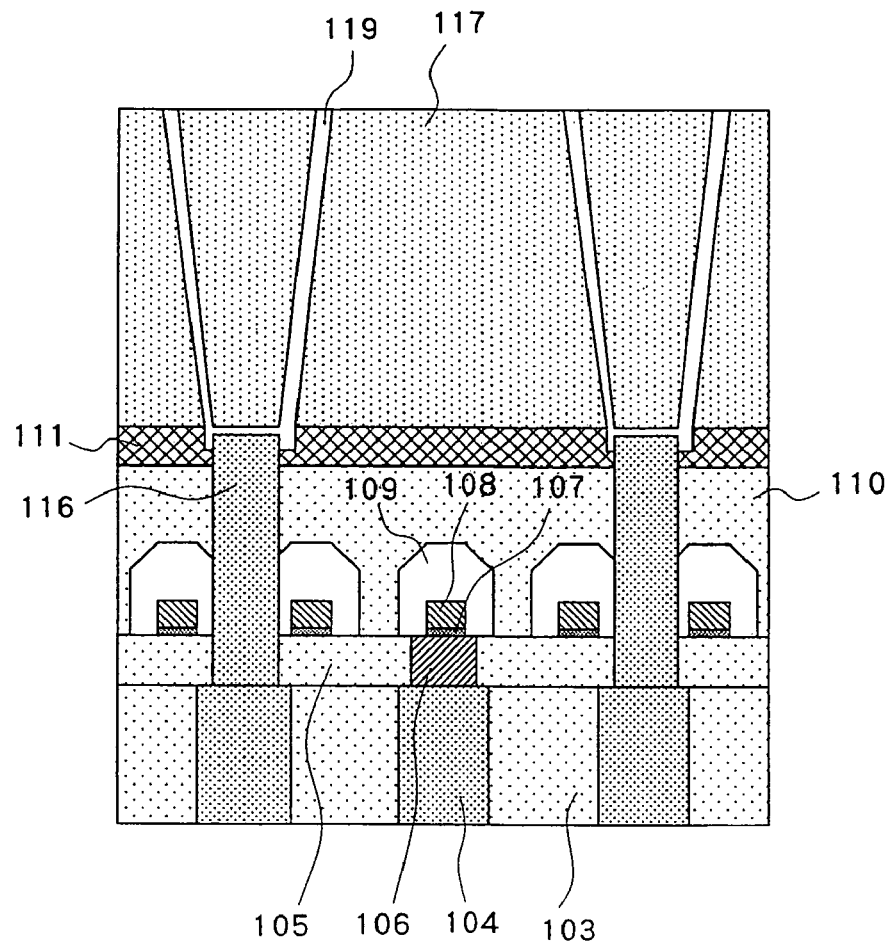
FIG. 1 is a cross section of a semiconductor memory in the process of manufacture using a conventional manufacturing method.
Figure 2:
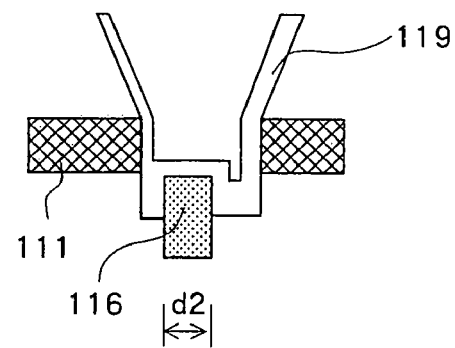
FIG. 2 is an enlarged cross section of a contact portion between the lower electrode and the plug shown in FIG. 1.

FIG. 12A shows an enlarged contact portion between lower electrode 21 and polysilicon plug 18. As is apparent from the comparison between FIG. 12A and FIG. 2, large-diameter portion 18a formed at the upper end of polysilicon plug 18 ensures sufficient contact area for lower electrode 21, while the diameter (d1) of plug 18 remains the same as the diameter (d2) of polysilicon plug 116 of the prior art shown in FIG. 2. As shown in FIG. 12B, the bottom face of lower electrode 21 is formed so as to have substantially an elliptical shape, with its major axis directed along the diameter of metal plug 6, and with its center offset from the center of polysilicon plug 18. This is for arranging lower electrodes 21 with high density. Large-diameter portion 18a of polysilicon plug 18 is formed to be slightly larger than the bottom face of lower electrode 21 and to have a figure similar to the bottom face, so that the entire bottom face of lower electrode 21 overlaps with large-diameter portion 18a of polysilicon plug 18. In other words, the bottom face of lower electrode 21 does protrude from large-diameter portion 18a of polysilicon plug 18. This means that large-diameter portion 18a functions as a perfect etching stopper layer when hole 20 (FIG. 10) is formed. Specifically, according to the present invention, excessive etching of silicon nitride film 11 or silicon oxide film 12 is avoided. As a result, as shown in FIG. 12A, the bottom face of lower electrode 21 is presented to be planar with no step formed therein.

As described above, according to the method for manufacturing a semiconductor memory of the present invention, formation of the large-diameter portion at the upper end of the capacitive contact plug ensures a sufficient contact area between the plug and the lower electrode of the capacitor. Further, the large-diameter portion of the plug functions as an etching stopper layer in the etching step to form the lower electrode. Therefore, there is no need to separately form an etching stopper layer, or to remove the etching stopper layer after etching. In this connection, the problem of excessive etching of a foundation layer can be avoided, which would have occurred at the time of removing the etching stopper layer.

Moreover, since the bottom face of the lower electrode is planarized, a possible increase in leak current due to deterioration of coverage or concentration of an electric field can be avoided. In addition, since the large-diameter portion of the plug is formed simultaneously with the plug, as a part of the plug, the number of steps for manufacturing a semiconductor memory is not increased to form the large-diameter portion.

While a preferred embodiment of the present invention has been described using specific terms, such description is for illustrative purposes only, and it is to be understood that changes and variations may be made without departing from the spirit or scope of the following claims.

What is claimed is:

1. A method for manufacturing a semiconductor memory having a memory cell selection transistor and a capacitor, the method comprising:
    forming a silicon oxide-based first insulating film around a bit line formed on a semiconductor substrate;
    forming a silicon nitride-based second insulating film on said first insulating film;
    forming a silicon oxide-based third insulating film on said second insulating film;
    forming a first resist mask on said third insulating film;
    forming a first hole that reaches said first insulating film through said second and third insulating films;
    forming a resist mask having an opening, whose diameter is larger than that of said first hole, on said third insulating film;
    forming a second hole that reaches a first plug for establishing electrical connection with a diffusion layer of said memory cell selection transistor;
    forming a second plug by depositing plug material inside said second hole;
    forming a silicon oxide-based fourth insulating film on said second plug;
    forming a third hole by etching said fourth insulating film using an end face of said second plug as an etching stopper layer; and
    forming a conductive film inside said third hole so as to serve as an electrode for said capacitor,
    wherein said second hole is formed by etching, using said resist mask as an etching mask, under conditions in which an etching rate for said first and third insulating films is higher than an etching rate for said second insulating film.

* * * * *